US005253188A

United States Patent [19]

Lee et al.

[11] Patent Number: 5,253,188

[45] Date of Patent: Oct. 12, 1993

[54] BUILT-IN SYSTEM FOR ANTENNA CALIBRATION, PERFORMANCE MONITORING AND FAULT ISOLATION OF PHASED ARRAY ANTENNA USING SIGNAL INJECTIONS AND RF SWITCHES

[75] Inventors: Kuan M. Lee, Brea; Ruey S. Chu, Cerritos; Sien-Chang C. Liu, Brea, all of Calif.

[73] Assignee: Hughes Aircraft Company, Los Angeles, Calif.

[21] Appl. No.: 688,651

[22] Filed: Apr. 19, 1991

[51] Int. Cl.[5] .............................................. G01R 35/00

[52] U.S. Cl. .......................... 364/571.02; 364/571.01; 343/808

[58] Field of Search ............... 343/808, 773, 774, 786; 342/173, 373, 360, 368

[56] References Cited

U.S. PATENT DOCUMENTS 4,949,090 8/1990 Tamii et al. ......................... 342/173
5,086,302 2/1992 Miller ................................. 342/373

*Primary Examiner*—Jack B. Harvey
*Assistant Examiner*—Thomas Peeso
*Attorney, Agent, or Firm*—Wanda K. Denson-Low

[57] ABSTRACT

An apparatus for testing a microwave phased array antenna having a plurality of radiating elements includes a transmission line for signal injection and switching components to selectively establish signal paths from a transmitter, and through a plurality of transmit/receive modules, to a performance monitor. In accordance with the present invention the switching components can be set to establish a receive signal path through the apparatus to test the receive mode of the individual modules. Alternatively, the switching components can be set to establish a transmit signal path through the apparatus to test the transmit mode of the individual modules. Further, the switching components can be set to selectively establish a receive signal path or a transmit signal path through either isolated individual modules or through all modules simultaneously. The system monitor then tests the signals which pass through the modules on the receive signal path and the transmit signal path to determine the operational status of the module and the phased array antenna.

13 Claims, 2 Drawing Sheets

BUILT-IN SYSTEM FOR ANTENNA CALIBRATION, PERFORMANCE MONITORING AND FAULT ISOLATION OF PHASED ARRAY ANTENNA USING SIGNAL INJECTIONS AND RF SWITCHES

FIELD OF THE INVENTION

The present invention pertains generally to microwave phased array antennas. More particularly, the present invention pertains to systems and apparatus which are useful for monitoring, calibrating and isolating faults in the components of a microwave phased array antenna. The present invention is particularly, but not exclusively, useful for calibration, monitoring and fault isolation techniques associated with airborne antennas.

BACKGROUND OF THE INVENTION

As is well known, a phased array antenna has an array of identical radiators (waveguides, horns, slots, dipoles etc.) with electronic means for altering the phase of power fed to each of them. This allows the shape and direction of the radiation pattern to be altered without mechanical movement and with sufficient rapidity to be made on a pulse-to-pulse basis. Not surprisingly, the proper operation of a phased array antenna requires periodic monitoring for faults in the system, with the consequent need for calibration of misaligned components or the replacement of defective components. For such monitoring, the two most important performance parameters of the antenna are; 1) the radio frequency (RF) amplitude; and 2) the phase of each-signal path from each antenna radiator to the receiver. Furthermore, with accurate amplitude and phase information for each radiator element, other antenna performance factors, such as gain, monopulse null depth and sidelobe pattern can be determined.

Various attempts have been made in the past to provide some system for monitoring a phased array antenna. One known method incorporates a control loop for each array element. Unfortunately, these loops are complicated, bulky and relatively expensive. Another known method for monitoring phases array antennas uses coupler injected signals through the feed. It happens, however, that the accuracy of such a device can be questionable. In still another example, U.S. Pat. No. 4,468,669 for an invention entitled "Self Contained Test Device" discloses twin-lead transmission lines for signal injection but uses a phase toggling technique for fault isolation which was intended for passive array antennas. The present invention recognizes there is a need for an apparatus to monitor phased array antennas which is effective and reliable for use with both active and passive antennas.

In light of the above, it is an object of the present invention to provide an antenna calibration system which will maintain low sidelobes under operational conditions, e.g. while airborne. Another object of the present invention is to provide an antenna calibration system which is capable of performance monitoring, antenna calibration, fault isolation and fault correction for either an active or a passive phased array antenna. Still another object of the present invention is to provide an antenna calibration system which can be relatively easily incorporated into existing antenna systems. Yet another object of the present invention is to provide an antenna calibration system which is simple to use, relatively easy to manufacture and implement, and comparatively cost effective.

SUMMARY OF THE INVENTION

An apparatus for testing a microwave phased array antenna having a plurality of radiating elements includes a transmission line and switching components to selectively establish signal paths from a transmitter, and through a plurality of transmit/receive modules, to a performance monitor. In accordance with the present invention the switching components can be set to establish a receive signal path through the apparatus to test the receive mode of the individual modules. Alternatively, the switching components can be set to establish a transmit signal path through the apparatus to test the transmit mode of the individual modules. Further, the switching components can be set to selectively establish a receive signal path or a transmit signal path through either isolated individual modules or through all modules simultaneously. In this way, the system monitor tests the signals which pass through the modules on the receive signal path and on the transmit signal path to determine the operational status of the module.

The transmitter of the apparatus is connectable via a transmitter switch to a transmit feed to generate a transmit signal. The transmitter switch disconnects the transmitter from the transmit feed while a directional coupler couples a signal from the transmitter to a signal injector feed for generating a receive signal. This transmitter switch and specific other switches in the apparatus are concertedly operated by a microprocessor to send either the transmit signal or the receive signal through the testing apparatus. A line switch is used to alternatively connect the transmission line to either the signal injector or to the system monitor. Additionally, each transmit/receive module in the apparatus has a high power switch which can connect the module to a radiating element of the antenna. The signal is coupled between the radiating element and the transmission line. Each module also has a low power switch which is connectable to either the receive feed and the performance monitor or the transmit feed.

In the operation of the apparatus of the present invention the receive signal path is established when the transmitter switch disconnects the transmitter from the transmit row feed, while a signal from the transmitter couples to the signal injector feed through a directional coupler. The line switch is set to connect the signal injector feed to the transmission line. Simultaneously the high power switch on the particular module to be tested connects the receive components of the module with the associated antenna radiating element. A receive signal is coupled from the transmission line through the radiating element to the T/R module's receive path. While the module is so coupled with the transmission line the module's low power switch connects the module to the receive feed and consequently to the performance monitor. With these connections, a receive signal generated at the signal injector feed will pass through the module for test and analysis by the system monitor.

The transmit signal path through the apparatus is established when the transmitter switch is set to connect the transmitter with the transmit feed. Additionally, the low-power switch of the particular module to be tested is set to connect the module to the transmit feed, and its high power switch is set to connect the transmit components of the module with the radiating element for coupling with the transmission line. The line switch is set to connect the transmission line to the performance monitor. With these connections, a transmit signal generated by the transmitter at the transmit row feed will pass through the module for test and analysis by the system monitor.

Performance monitoring of the antenna array can be accomplished by programming the microprocessor to send transmit signals or receive signals simultaneously through all modules in the apparatus. Further, by properly sequencing the selector switches of the apparatus, each module can be and thus to be the only module through which a transmit or a receive signal is passed. Consequently, the testing apparatus of the present invention can identify specific modules which are faulty, or determine a fault which is external to the modules based on a determination that all modules indicate the same fault condition. Additionally, the present invention can include a performance display which creates a fault detection map for individually and collectively indicating module operating status.

In an alternate embodiment of the present invention, a signal injector can be provided for a passive array microwave antenna. For this embodiment, the receive signal generated by the transmitter is sent from the signal injector feed and through the transmission line and module and through the receive feed to the performance monitor through a switching system similar to the receive signal path disclosed for the preferred embodiment.

The novel features of this invention, as well as the invention itself, both as to its structure and its operation will be best understood from the accompanying drawings, taken in conjunction with the accompanying description, in which similar reference characters refer to similar parts, and in which:

DESCRIPTION OF THE PREFERRED EMBODIMENTS

Figure 1:
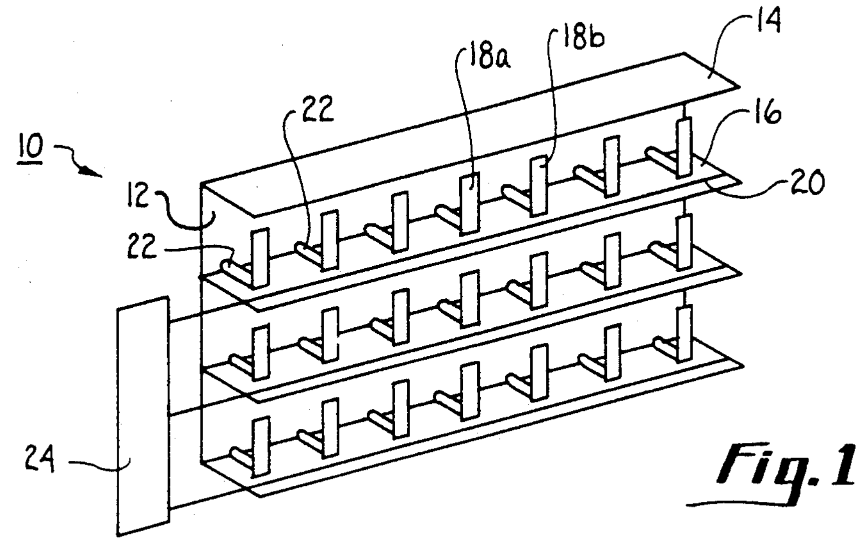
FIG. 1 is a perspective view of an embodiment for the phased array antenna of the present invention with selected electronic components shown schematically for clarity.

Referring initially to FIG. 1, one embodiment of a phased array antenna configuration in accordance with the present invention is shown and generally designated 10. For this configuration, the antenna 10 includes a ground plane 12 on which a plurality of parallel plates are mounted to establish a series of parallel plate wave guides. The plate 14 and the plate 16, together with the ground plane 12, establish one such parallel plate wave guide. As shown, a plurality of monopole radiating elements, of which the radiating elements 18*a* and 18*b* are exemplary, are mounted along the wave guide between the plates 14 and 16. Additionally, a single wire transmission line 20 is positioned in the wave guide for coupling with the radiating elements 18. A coaxial line 22 connects individual radiating elements 18 with components (not shown in FIG. 1) for transmitting signals with the antenna 10, and the transmission line 20 is connectable with a signal injector feed 24.

Figure 2:
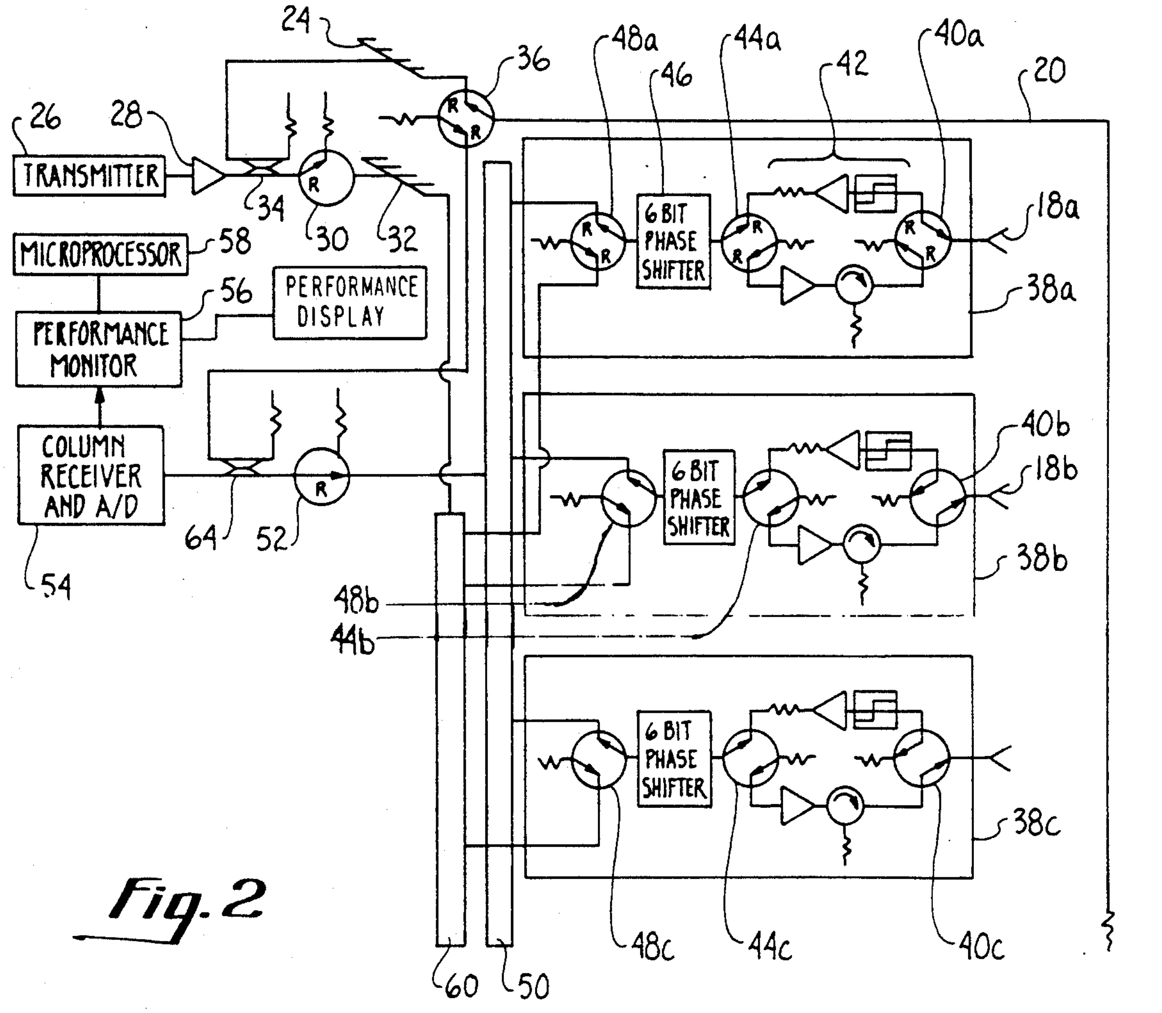
FIG. 2 is a schematic block diagram of the electronic components of the present invention for an active antenna array with an isolated transmit/receive module switched for test in the receive mode.
Figure 3:
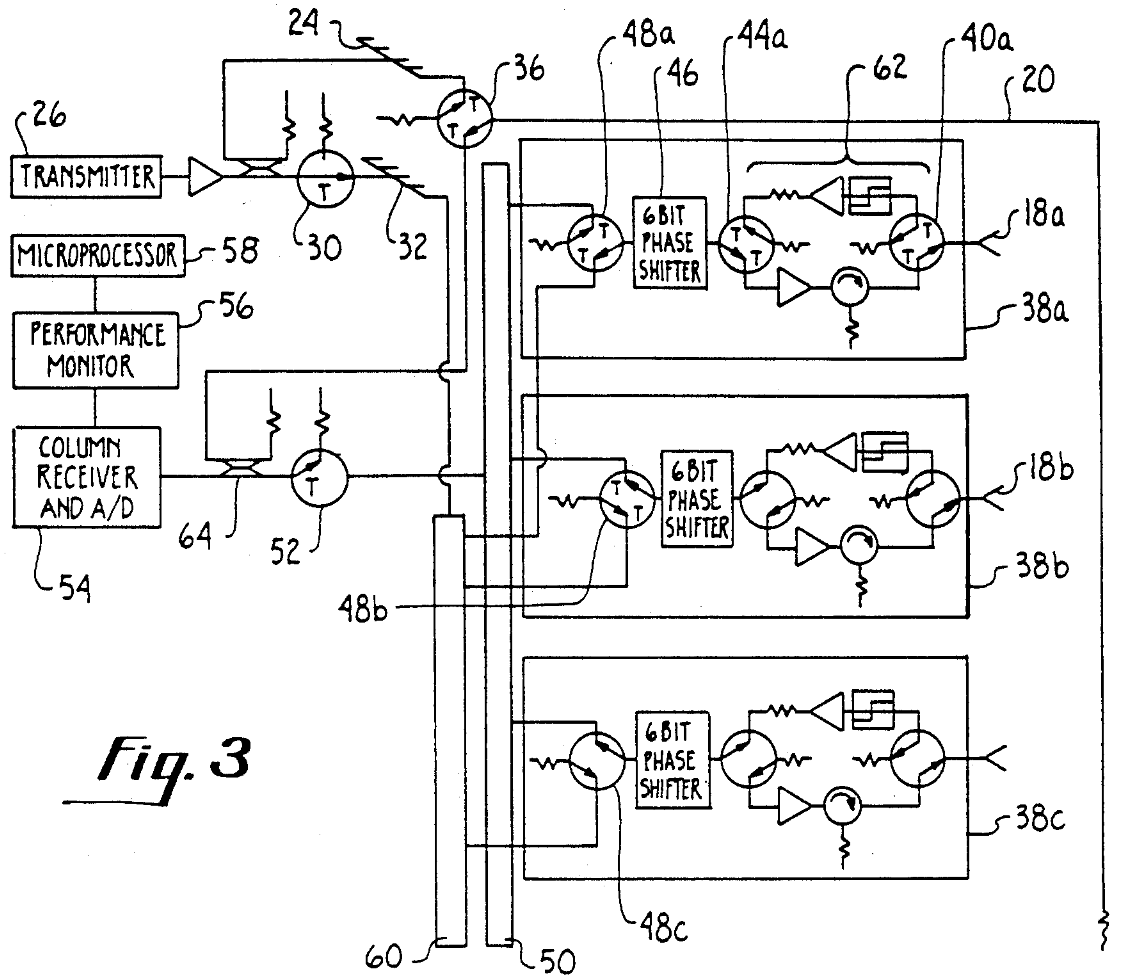
FIG. 3 is a schematic block diagram of the electronic components of the present invention for an active antenna array with an isolated transmit/receive module switched for test in the transmit mode.

The operational components of the present invention, and their interconnection, will be best appreciated with reference to FIG. 2 and FIG. 3 wherein these interrelationships are shown schematically. In FIG. 2 it will be seen that a transmitter 26, of any type well known in the art, is connected to a power amplifier 28. The output of the power amplifier 28 is connected to a transmitter switch 30 which, when closed, connects the transmitter 26 to a transmit row feed 32. When open, this connection between transmitter 26 and transmit row feed 32 is broken and signals from transmitter 26 are coupled to the signal injector feed 24 through a coupler 34. A line switch 36 is positioned to connect signal injector feed 24 with the transmission line 20 when in one of its switching configurations.

As shown in both FIGS. 2 and 3, the phased array antenna 10 of the present invention includes a plurality of transmit/receive (T/R) modules 38. The modules 38 *a, b,* and *c* are, of course, only exemplary. As will be appreciated by the skilled artisan, there are many more such T/R modules 38 in a typical phased array antenna 10. The T/R module 38*a* is singled out here only for purposes of disclosure. As is well known in the pertinent art, each module 38 in the antenna 10 establishes the phase and amplitude of the portion of the signal radiated from the associated radiating element 18 of the antenna 10. For purposes of the present invention, the T/R modules 38 are of a L-BAND type which is manufactured by Hughes Aircraft Company, Ground Systems Group.

As shown in FIG. 2 the T/R module 38*a* has a high power T/R switch 40*a* which connects the T/R module 38*a* and the radiating element 18*a*. High power T/R switch 40*a* is also connected with the receive path components 42 (including low noise amplifier and limiter) in T/R module 38*a* and these receive path components 42 are, in turn connected with an intermediate switch 44. The switch 44 is connected to one port of a phase shifter 46 and the other port of phase shifter 46 is connected to a low power T/R switch 48*a*. As shown in FIG. 2, the T/R module 38*a* is connectable with a receive column feed 50 through the low power T/R switch 48*a*.

The receive column feed 50 is in connection with a receive switch 52 which connects the receive column feed 50 with a receiver and an analog to digital A/D converter 54. Digital signals from the A/D converter 54 are passed to a performance monitor 56 where the signal is compared with preprogrammed input from a microprocessor 58 and then analyzed for future use in determining the operation status of the antenna 10.

In light of the disclosure above, it is to be appreciated that; with the transmitter switch open, the line switch 36 configured to connect the signal injector feed 24 to the transmission line 20, and with the switches 40*a*, 44*a* and 48*a* of module 38*a* set as shown, a receive signal path is established through the T/R module 38*a*. For this receive path, the transmitter 26 is coupled to the signal injector feed 24 to transmit a signal from the transmitter to the transmission line 20. The radiating element 18*a* of T/R module 38*a* is then coupled with the transmission line 20 to carry the signal through T/R module 38a. T/R module 38a, in turn, is connected through the receive feed 50 and the A/D converter 54 to pass the signal to the performance monitor 56 and complete the receive signal path.

In FIG. 2, while a receive signal path has been shown established through the T/R module 38a, the other T/R modules 38b et seq. are shown in a dummy mode and will not pass a signal. Specifically, the high power T/R switches 40b and c, in concert with the intermediate switches 44b and c of T/R modules 38b and c, respectively, break the signal path and place these modules 38 in a dummy mode. Consequently, only T/R module 38a is monitored. It is to be appreciated, however, that signal paths can be simultaneously established through all of the modules 38, as well as individually. Further, signal paths can be sequentially established through the T/R modules 38.

FIG. 3 provides a schematic for the transmit signal path of the antenna 10 which can be established to test the transmission capability of the antenna 10. Specifically, to establish the transmit signal path, the transmitter switch 30 is closed to create a signal path from the transmitter 26 through the transmit row feed 32 to the transmit column feed 60. Again, using T/R module 38a as an example, for the transmit signal path the low power T/R switch 48a is set for connection between transmit column feed 60 and phase shifter 46. The intermediate switch 44a then directs the signal through the transmit path components 62 (including high power amplifier and circulator) and high power T/R switch 40a is configured to connect T/R module 38a with the radiating element 18a. Radiating element 18a is, as always, positioned to be coupled with the transmission line 20 and the transmit signal path is continued through line switch 36 to connect the transmission line 20 with A/D converter 54 through the coupler 64. As with the receive signal path, the transmit signal path ends at the performance monitor 56 and the microprocessor 58.

While the transmit signal path can be established through T/R module 38a as disclosed above, the other modules 38 can be placed in a dummy mode. Specifically, as shown in FIG. 3, each of the low power T/R switches 48 on the modules 38 which are not in the transmit signal path are set to not allow the passage of the signal through the particular T/R module 38. Thus, these modules 38 can be isolated. As was disclosed above for the receive signal path, a transmit signal path can be simultaneously established through all of the modules 38. Further, a transmit signal path can be established through each T/R module 38 in sequence.

As intended for the present invention, the receive signal paths and the transmit signal paths are established through the antenna 10 by the proper and concerted operation of the switches 30, 36, 40 a–c, 44 a–c, 48 a–c, and 52. This can be accomplished in a manner well known in the pertinent art by properly programming the microprocessor 58. With such programming, each module 38 can be individually monitored and a fault detection map generated which will precisely locate the faulty module 38. In the event all modules 38 indicate a low amplitude, the trouble may be isolated to be in either the receive feed 50 or the transmission feed 60. In any event, component replacement can be made.

Figure 4:
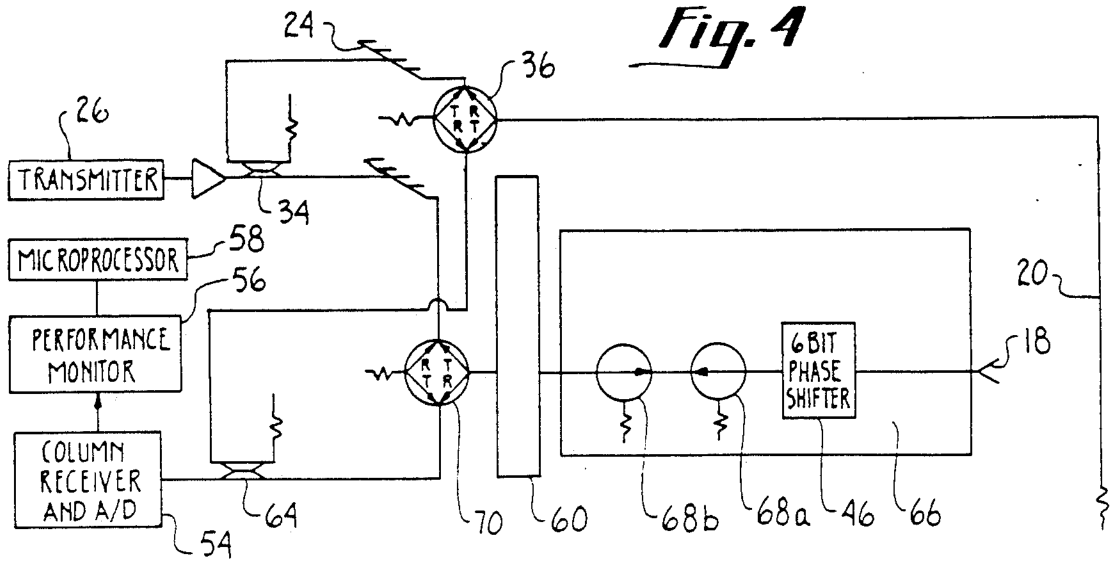
FIG. 4 is a schematic block diagram of the electronic components of the present invention for a passive antenna.

With some modification, a system for monitoring a passive array antenna can be established. As shown in FIG. 4 such a system is established using a T/R module 66 which incorporates two single pole, double throw switches 68a and 68b. For this configuration the switch 68b is connected with the transmission feed 60 and a selector switch 70 can alternately connect the transmission feed 60 with either the transmitter 58 or the A/D converter 54 and performance monitor 56. Simultaneously, depending on the configuration of selector switch 70, line switch 36 can be set to couple the transmission line 20 with either the transmitter 26 or with the A/D converter 54 and performance monitor 56. Specifically, with the selector switch 70 set to connect the transmitter 26 to the transmission feed 60, line switch 36 is set to couple the transmission line 20 with the performance monitor 56. This will place module 66 in its normal operating mode. On the other hand, to test monitor the module 66, the line switch 36 is set to couple the transmitter 26 with transmission 20 and the selector switch 70 is set to connect the transmission feed 60 to the performance monitor 56. Further, though not shown in FIG. 4, it is to be appreciated that a plurality of T/R modules 66 will be used for a passive array antenna, and that with the concerted operation of the switches 68 a, b each module 66 can be isolated from the rest and individually test monitored. Again, the modules 66 can be either individually or collectively test monitored for the reasons and purposes disclosed above for the modules 38 of an active phased array antenna 10.

While the particular apparatus for test monitoring a phased array antenna as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims.

We claim:

1. An apparatus for monitoring a microwave antenna array having a plurality of radiating elements and a plurality of transmit/receive modules, each transmit/receive module being coupled with one of said radiating elements; which comprises:

a transmitter for generating a test signal;

a performance monitor for testing said antenna array a transmission line for coupling with said radiating elements;

switch means coupled between said transmitter and said transmission line and said transmit/receive modules for alternately coupling said test signal to said transmission line or to said transmit/receive modules; and switching means coupled between said transmit/receive modules and said performance monitor for selecting one of said transmit/receive modules and selectively passing said test signal, in sequence, either through said transmit/receive module and said transmission line to said performance monitor to test the transmit operation of said radiating element and selected transmit/receive module, or through said transmission line and said transmit/receive module to said performance monitor, to test to receive operation of said radiating element and said selected transmit/receive module.

2. An apparatus as recited in claim 1 further comprising:

a transmit feed coupled between said transmitter and said transmit/receive modules; and a signal injector feed coupled between said transmitter and said transmission line;

wherein said switch means comprises a transmitter switch for selectively connecting said transmitter with said transmit feed or said signal injector feed; and a line switch for selectively connecting said transmission line with said signal injector feed or said performance monitor.

3. An apparatus as recited in claim 2 wherein each transmit/receive module further comprises means to establish the phase and amplitude of the portion of the signal radiated from its respective radiating element, each said transmit/receive module having a low power switch for alternatively connecting said transmit/receive module with said transmit feed or said performance monitor, and each said transmit/receive module having a high power switch for selectively connecting said transmit/receive module to its respective radiating element.

4. An apparatus as recited in claim 3 wherein said performance monitor comprises a microprocessor and an analog/digital (A/D) converter electronically connected with a performance display.

5. An apparatus as recited in claim 4 wherein said switching means comprises said transmitter switch, said line switch, said high power switch and said low power switch, and said microprocessor is connected to said switching means to establish a receive signal path through said apparatus for testing a receive mode of said selected module and a transmit signal path through said apparatus for testing a transmit mode of said selected module.

6. An apparatus as recited in claim 5 wherein said receive signal path is established from said transmitter through said transmitter switch, said signal injector feed, said line switch, said transmission line, said high power switch, said module, and said low-power switch to said performance monitor; and said transmit signal path is established from said transmitter through said transmitter switch, said transmit feed, said low-power switch, said module, said high power switch, said transmission line, and said line switch to said performance monitor.

7. An apparatus as recited in claim 5 wherein said microprocessor concertedly operates said selector switches on said switching means to simultaneously establish said receive signal path or said transmit signal path through said plurality of modules to collectively test said modules in a respective said receive mode or said transmit mode.

8. An apparatus as recited in claim 7 wherein said performance display comprises means for creating a fault detection map for individually and collectively indicating module operating status.

9. An apparatus for test monitoring a microwave antenna array having a plurality of radiating and a plurality of transmit/receive modules, each transmit/receive module being coupled with one of said radiating elements, which comprises:

a transmission line for coupling with said radiating elements;

a transmitter for generating a test signal, a transmit feed coupled to said transmit/receive modules and an injection feed coupled to said transmission line;

a transmitter switch coupled between said transmitter and said transmit feed and said injection feed for alternately coupling said test signal to said transmission line or to said transmit/receive modules;

a performance monitor;

each said transmit/receive module having a low power transmit/receive switch for alternately connecting said transmit/receive module with said transmit feed to test the transit operation of said radiating element and said transmit/receive module or said performance monitor to test the receive operation of said radiating element and said transmit/receive module, and each said transmit/receive module having a high power transmit/receive switch for selectively connecting said transmit/receive module to said radiating elements for transmitting said test signal to said transmission line or receiving said test signal from said transmission line;

a line switch selectively connecting said transmission line with said injection feed to test the receive operation of said radiating element and said transmit/receive module or said performance monitor to test the transmit operation of said radiating element and said transmit/receive module; and switching means for concertedly operating said transmit switch, said line switch, said high power transmit/receive switch and said low power transmit/receive switch to selectively send said test signal through said transmit/receive module to test said transmit/receive module and its radiating element.

10. An apparatus as recited in claim 9 wherein said performance monitor comprises a microprocessor and an analog/digital (A/D) converter electronically connected with a performance display and wherein said performance display comprises means for creating a fault detection map for individually and collectively indicating module operating status.

11. An apparatus as recited in claim 10 wherein said microprocessor is connected to said switching means to selectively establish a receive signal path through each said transmit/receive module, and selectively establish a transmit signal though each said transmit/receive module of said apparatus for testing a transmit mode of said transmit/receive module.

12. An apparatus as recited in claim 11 wherein said receive signal path is established from said transmitter with coupling through said injection feed, said line switch, said transmission line, said high power switch, said module, and said low power switch to said performance monitor, and said transmit signal path is established from said transmitter through said transmitter switch, said transmit feed, said low power switch, said module, said high power switch, said transmission line, and said line switch to said performance monitor.

13. An apparatus as recited in claim 12 wherein said microprocessor concertedly operates said high power switches on said modules to simultaneously establish said receive signal path or said transmit signal path through said plurality of modules to collectively test said modules in a respective said receive mode or said transmit mode.

* * * * *